(12) United States Patent
Chvalevsky et al.

(10) Patent No.: US 12,175,178 B1
(45) Date of Patent: Dec. 24, 2024

(54) FUZZY SCOREBOARD

(71) Applicant: Amazon Technologies, Inc., Seattle, WA (US)

(72) Inventors: Max Chvalevsky, Mevaseret Zion (IL); Uri Leder, Lotem (IL)

(73) Assignee: Amazon Technologies, Inc., Seattle, WA (US)

( * ) Notice: Subject to any disclaimer, the term of this patent is extended or adjusted under 35 U.S.C. 154(b) by 475 days.

(21) Appl. No.: 17/457,807

(22) Filed: Dec. 6, 2021

(51) Int. Cl.
   *G06F 30/3323* (2020.01)

(52) U.S. Cl.
   CPC .............................. *G06F 30/3323* (2020.01)

(58) Field of Classification Search
   CPC ...... G06F 30/20; G06F 30/33; G06F 30/3323; G06F 30/3308; G06F 30/367
   USPC ......................................................... 716/136
   See application file for complete search history.

(56) References Cited

U.S. PATENT DOCUMENTS

| | | | |
|---|---|---|---|
| 2010/0180168 A1* | 7/2010 | Ward | G01R 31/318566 |
| | | | 714/E11.155 |
| 2010/0257494 A1* | 10/2010 | Pouarz | G06F 30/3323 |
| | | | 716/111 |
| 2018/0003768 A1* | 1/2018 | Douskey | G01R 31/3187 |
| 2019/0066813 A1* | 2/2019 | Perner | G11C 29/76 |

* cited by examiner

*Primary Examiner* — Paul Dinh
(74) *Attorney, Agent, or Firm* — Weaver Austin Villeneuve & Sampson LLP

(57) ABSTRACT

A fuzzy scoreboard can compute, using a signature function, a first signature of an expected data stream associated with an input data stream that is being inputted to a design-under-test (DUT) for a datapath test. The first signature of the expected data stream can be stored without storing the expected data stream. The fuzzy scoreboard can also compute, using the same signature function, a second signature of an output data stream that is outputted from the DUT during the datapath test. The first signature can be compared with the second signature to determine whether there is a match. Storing the first signature of the expected data stream without storing the expected data stream can reduce the memory space consumed by the fuzzy scoreboard.

21 Claims, 5 Drawing Sheets

FUZZY SCOREBOARD

BACKGROUND

Size of integrated circuits has been increasing to support complex functionalities demanded by modern day applications such as artificial intelligence (AI), Internet-of-Things (IoT), networking, cloud computing, or high-performance computing, among others. Verification process is a critical step in the product development cycle of an integrated circuit, and can be used to uncover potential errors in the design or the architecture of the design. Scoreboards can be used in different verification environments to verify data integrity of a design-under-test (DUT) at different levels.

BRIEF DESCRIPTION OF THE DRAWINGS

Various embodiments in accordance with the present disclosure will be described with reference to the drawings, in which.

DETAILED DESCRIPTION

Figure 1:
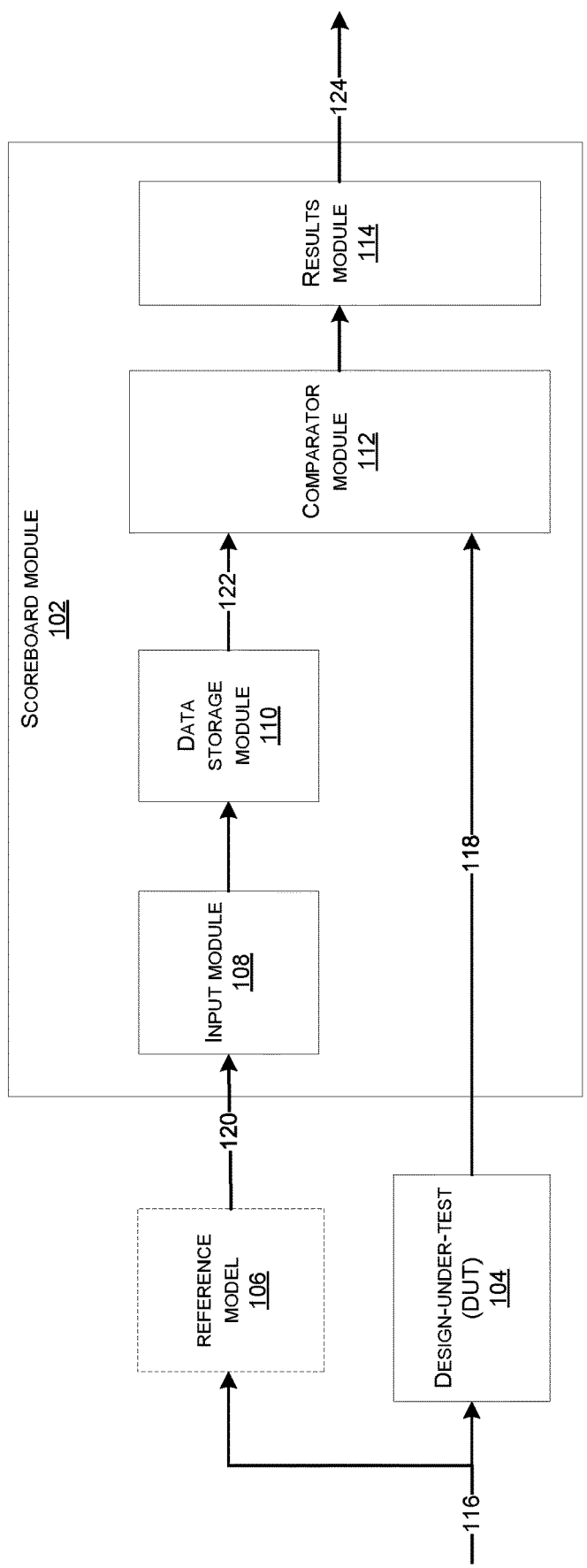
FIG. 1 illustrates a testbench comprising a scoreboard module that can be used to verify a design-under-test (DUT)

A thorough verification of the design of an integrated circuit before tape-out is crucial in order to minimize design re-spins. Design verification is an essential step in the product development process for integrated circuits. Design verification may involve various techniques including simulation, functional verification, or formal verification to verify that a design-under-test (DUT) behaves as intended. Simulation can include testing the DUT against various stimuli and comparing the output with the expected results. Functional verification can be used to uncover potential errors in the design or architecture of the DUT using behavior modeling or testbenches. Emulation can also be used to map a hardware description language (HDL) representation of the DUT to field-programmable gate arrays to perform the function verification of the hardware and software of the DUT. Formal verification may generally rely on model checking techniques to prove or disprove correctness of the DUT using mathematical models based on a formal specification.

Scoreboards can be used to check integrity of data by comparing the expected output of the DUT with the actual output of the DUT for a given set of inputs. Generally, the scoreboards used in formal verification are based on non-determinism, because formal verification is a static analysis that can simultaneously check all possible values of a non-deterministic input or variable. As such, the formal verification scoreboards can be very compact since they consume relatively smaller memory space in terms of logic and registers. However, simulation and emulation techniques do not rely on non-determinism, but instead rely on randomizing input values to catch bugs. As such, these techniques rely on FIFOs to store the data streams that are inputted to the DUT for a subsequent comparison with the data streams that are outputted from the DUT.

In some examples, a scoreboard can be used to compare two streams of data that are supposed to be identical with respect to values and order. In some examples, the DUT may include logic that outputs the data elements in the same order and values as they are received. For example, the DUT may include a pipeline with one or more pipeline stages, or an interconnect fabric that connects various source nodes and target nodes. In most cases, an input data stream being fed into a DUT during a datapath test can be stored and compared with an output data stream that is coming out of the DUT. For example, a scoreboard can be used to verify whether the ingress and egress of the DUT match. However, the scoreboard's FIFOs can consume lot of memory space, which can be enormous for larger designs.

Embodiments provide a fuzzy scoreboard, which can consume less memory space to verify a DUT as compared to full scoreboards described above. As an example, a datapath test can be performed on the DUT by feeding an input data stream into the DUT. In some embodiments, the fuzzy scoreboard can generate a first signature of the input data stream using a signature function, and store the first signature of the input data stream without storing the input data stream itself. The fuzzy scoreboard can also generate, using the same signature function, a second signature of an output data stream outputted from the DUT during the datapath test, and compare the second signature with the first signature to determine whether there is a match.

In some embodiments, the comparison may be performed at the end of the datapath test when all the output data corresponding to the input data has been outputted from the DUT. The comparison can also be performed intermittently, for example, by comparing a first signature computed over a certain number of data elements inputted into the DUT with a second signature computed over the same number of data elements outputted from the DUT. The signature function can be based on a hash function, error correcting codes (e.g., Reed-Solomon code, Hamming code), cyclic redundancy check (CRC) codes, a commutative function, a non-commutative function, a proprietary function, or any suitable function. Thus, storing the first signature of the input data stream without storing the input data stream can provide significant savings on the memory space consumed by the scoreboard data structure.

In some embodiments, a reference or a golden model can be used to test datapaths that modifies or transforms the data. The reference or a golden model can generate an expected output data stream from an input data stream. The reference model can be a behavioral or functional model of the DUT. The input data stream that is fed to the DUT for the datapath test can also be fed to the reference model. The output of the reference model can be the expected output data stream. The signature function can be used to generate a first signature of the expected output data stream generated by the reference model. The first signature can be stored instead of storing the expected output data stream from the reference model. A second signature can be generated from the output data stream of the DUT using the same signature function. The first signature can be compared with the second signature to determine if there is a match. The comparison can be performed at the end of the datapath test or during the datapath test by comparing the first signature computed over a certain number of data elements in the expected data stream with the second signature computed over the same number of data elements outputted from the DUT.

In some embodiments, when the second signature matches with the first signature, it may indicate that data elements in the output data stream has a same ordering and values as data elements in the expected data stream. In some embodiments, when a mismatch is found between the second signature and the first signature, it may indicate that the output data stream and the expected data stream have a different order, or a data element in the expected data stream has different values than a corresponding data element in the output data stream. In such cases, the datapath test can be repeated using a different scoreboard structure (e.g., a full scoreboard) and the output data stream from the DUT can be stored. The stored output data stream can be compared with a stored expected data stream to identify the mismatch. Thus, the embodiments can allow combining the fuzzy scoreboard with full scoreboards to identify the differences in the input and the output data streams.

The techniques disclosed by various embodiments can be used in different verification environments like simulation, formal verification, or emulation, using appropriate functions to generate the signature. In some embodiments, the width of the signature computed by the scoreboard can be controlled by the type of the function selected to compute the signature, which can ultimately control the memory space consumed by the scoreboard. In various embodiments, the width of the signature computed by the scoreboard can be independent of the size of the DUT, which can provide significant savings on memory space consumed by the scoreboard for large or complex designs, and can improve the performance of the verification process.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates a testbench 100 comprising a scoreboard module that can be used to verify a DUT.

The testbench 100 may include a generic scoreboard module 102 that can be used to verify the functionality of a DUT 104, one or more components of the DUT 104, or a datapath in the DUT 104. In various examples, the DUT 104 can be a system-on-a-chip (SoC), a multi-chip system, an intellectual property (IP) module, or any integrated circuit design configured to perform certain functionality. For example, the DUT 104 can be a network controller, an accelerator engine, a crypto engine, a GPU, or a peripheral device. The testbench 100 can be written in a hardware verification language (e.g., System Verilog®) or a programming language (e.g., C++).

The testbench 100 can be part of a simulation environment, a formal verification environment, or an emulation environment. In some instances, an input data stream 116 can be fed to the DUT 104 to test a certain functionality, component, datapath, state machine, configuration, or another feature. The input data stream 116 can be generated randomly, pseudo-randomly, in a predetermined manner, or a combination thereof. In some examples, the expected values outputted by the DUT 104 given the input data stream 116 can be predicted, or computed using a reference model 106. The reference model 106 may be designed to mimic the functionality of the DUT 104. For example, given the input data stream 116, the reference model 106 can generate an expected data stream 120. The reference model 106 can be a behavioral or functional model of the DUT 104. In some implementations, the reference model 106 can be written in a hardware description language (e.g., Verilog, VHDL) or a programming language (e.g., C++).

An example of the scoreboard module 102 may include an input module 108, a data storage module 110, a comparator module 112, and a results module 114. In some examples, the testbench 100 may include additional or different components to facilitate the verification process of the DUT 104 using the scoreboard module 102. For example, the testbench 100 may include one or more monitoring modules (not shown) to monitor different ports, signals, states, or interfaces of the DUT 104 based on the test being performed.

The input module 108 can be configured to provide an interface with the DUT 104 and/or the reference model 106 in the testbench 100. For example, the input module 108 may be configured to receive an expected data stream 120, which can be generated by the reference model 106, or can be same as the input data stream 116 in the absence of the reference model 106. In some examples, the reference model 106 can be used when the DUT 104 performs some computations and/or modifications on the input data stream 116 instead of just passing the input data stream 116 through a pipeline or a datapath to output an output data stream 118. The reference model 106 can be used to mimic the computations and/or modification performed by the DUT 104 on the input data stream 104 to generate the expected data stream 120. As an example, if the input data stream 116 includes network packets that need to be processed to strip out various headers in the network packets before going through a datapath in the DUT 104, the reference model 106 can be designed to perform the same processing on the network packets to generate the expected data stream 120 that should match with the output data stream 118.

The data storage module 110 may be configured to store the expected data stream 120 using any suitable data structure, e.g., registers, arrays, FIFOs, or queues, among others. In some examples, the testbench 100 may be used to perform a datapath test on the DUT 104. For example, the datapath test may be performed to test, for example, a pipeline or an interconnect fabric in the DUT 104 to determine whether an order and a value of each data element outputted from the DUT 104 matches with an order and a value of each data element inputted to the DUT 104. This may be especially useful in the systems based on protocols that require maintaining a certain order for data transfers, e.g., Advanced extensible Interface (AXI) protocol. In some cases, the data storage module 110 may be implemented using one or more FIFOs when maintaining the order of data transfer is important.

The comparator module 112 may be configured to compare a stored expected data stream 122, which is provided by the data storage model 110, with the output data stream 118 generated by the DUT 104. In some examples, the comparator module 112 may compare each data element in the stored expected data stream 122 with a corresponding data element in the output data stream 118 to determine if there is a match.

The results module 114 may be configured to provide a result 124 of the comparison performed by the comparator module 112 to the testbench 100 using any suitable interface. For example, the result 124 may indicate whether the datapath test passed or failed. In some examples, the result 124 may also include the mismatched data elements or an indication of the mismatch when the test failed.

In some cases, the DUT 104 may include a large or complex design that may require the input data stream 116 to include a large number of data elements to perform the datapath test. Thus, storing the large number of data elements in the data storage module 110 may require a large amount of memory space. Furthermore, use of the FIFOs to store the expected data stream 122 can be very costly to test large designs that are based on deterministic techniques.

Figure 2:
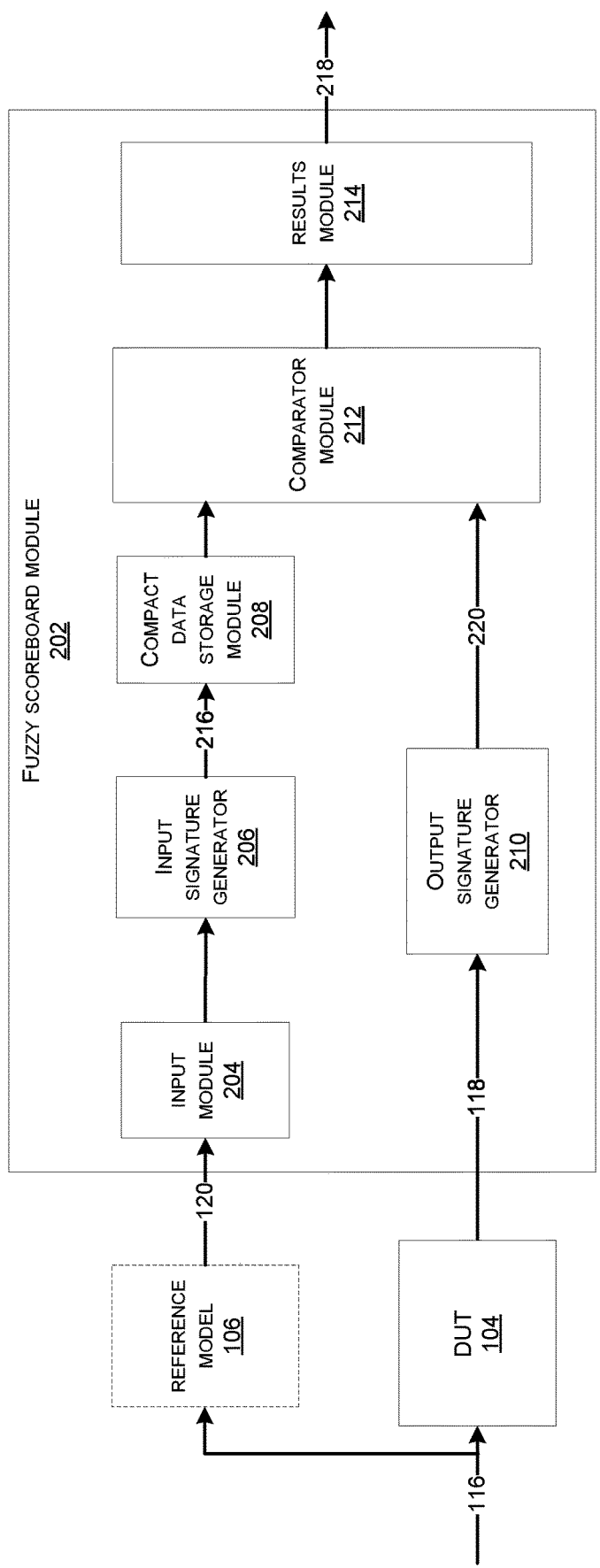
FIG. 2 illustrates a testbench comprising a fuzzy scoreboard module, according to some embodiments.

FIG. 2 illustrates a testbench 200 comprising a fuzzy scoreboard module 202, according to some embodiments. The testbench 200 can be written in a hardware verification language (e.g., System Verilog®) or a programming language (e.g., C++), and may include some of the components of the testbench 100 (e.g., the reference model 106, the DUT 104) described with reference to FIG. 1.

The fuzzy scoreboard module 202 may include an input module 204, an input signature generator 206, a compact data storage module 208, an output signature generator 210, a comparator module 212, and a results module 214. The input module 204 may be similar to the input module 108 in FIG. 1. For example, the input module 204 may be configured to receive the expected data stream 120 that is generated by the reference model 106, or is the same as the input data stream 116 in the absence of the reference model 106. The input data stream 116 and the expected data stream 120 can include data elements that may or may not have same order or values based on the functionality of the DUT 104 being tested. The input module 204 can forward the expected data stream 120 to the input signature generator 206.

The input signature generator 206 may be configured to generate a first signature 216 of the expected data stream 120 based on a signature function. The signature function can be based on a hash function, error correcting codes (e.g., Reed-Solomon code, Hamming code), CRC codes, a proprietary function, or any suitable function. In various embodiments, a commutative function can be used to generate the signatures if only the data values have to be checked and not the order, and a non-commutative function can be used when checking the order as well as the values are required. In various embodiments, a signature function can be selected based on the testbench environment (e.g., simulation, formal verification, or emulation), a type or size of the DUT 104, data storage requirements, type of the test, etc.

The first signature 216 can be stored in the compact data storage module 208. The compact data storage module 208 can be implemented using any suitable data structure such as registers, arrays, queues, or FIFOs, similar to the data storage module 110. However, the compact data storage module 208 may utilize much smaller memory space as compared to the memory space used by the data storage module 110 since storing the first signature 218 may occupy smaller space than storing the expected data stream 120, as discussed with reference to FIG. 1.

The output signature generator 210 may be configured to generate a second signature 220 of the output data stream 118 based on the same signature function as used by the input signature generator 206. In some embodiments, the signature function or a selection of the signature function can be an input to the testbench 200, which can be used by both the input signature generator 206 and the output signature generator 210.

The comparator module 212 may be configured to compare the first signature 216 stored in the compact data storage module 208 with the second signature 220 generated by the output signature generator 210 to determine if there is a match. In various examples, the comparator module 212 may perform the comparison whenever the expected data stream 120 and the output data stream 118 are in sync with respect to their progress (e.g., the number of data elements in the output data stream 118 outputted from the DUT 104 used in the generation of the second signature 220 is the same as the number of data elements in the expected data stream 120 used in the generation of the first signature 216), or at the end of the test. Output of the comparison can be used by the results module 214 to provide a result 218 to the testbench 200. The result 218 may indicate whether the datapath test passed or failed. The results module 214 may support any format to provide the result 218 based on the testbench environment 200.

In some rare instances, even though the expected data stream 120 and the output data stream 118 may not be the same, the first signature 216 and the second signature 220 can be identical due to the compression of the bits of a large number of data elements into a smaller signature width. In such cases, increasing the width of the signature can lower the probability of getting identical signatures on the non-identical data streams.

In some embodiments, when a mismatch is detected using the fuzzy scoreboard module 202, the datapath test can be repeated using a full scoreboard module similar to the scoreboard module 102, to identify the mismatched data elements. For example, the same input data stream 116 can be inputted to the DUT 104, and the expected data stream 120 as well as the output data stream 118 can be stored in the data storage module 110. The stored expected data stream 122 can be compared with the stored output data stream 118 to identify the exact location of the mismatched data elements to aid with the debug process. Other methods to compare the expected data stream 120 with the output data stream 118 to identify the mismatched elements are also possible, e.g., by manual inspection or debugging. As discussed previously, the mismatch can occur due to a difference in the order of the data elements or the values.

Figure 3B:
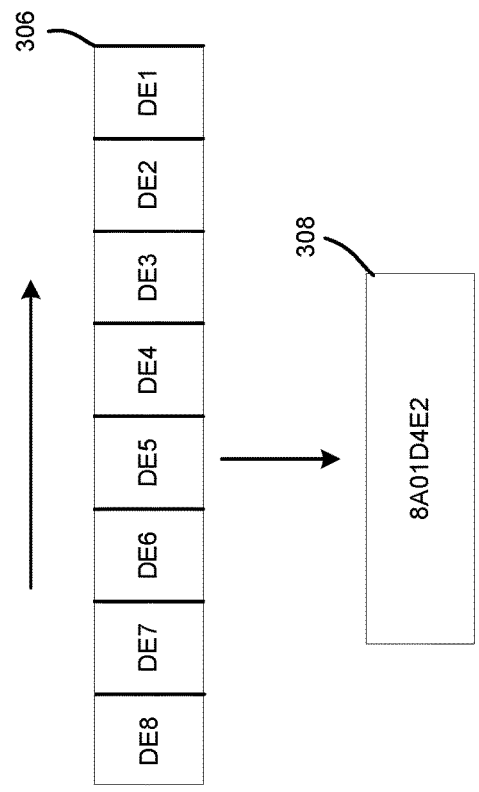
FIG. 3B illustrates an example of a second signature computed by a fuzzy scoreboard for a second data stream, according to some embodiments.
Figure 3C:
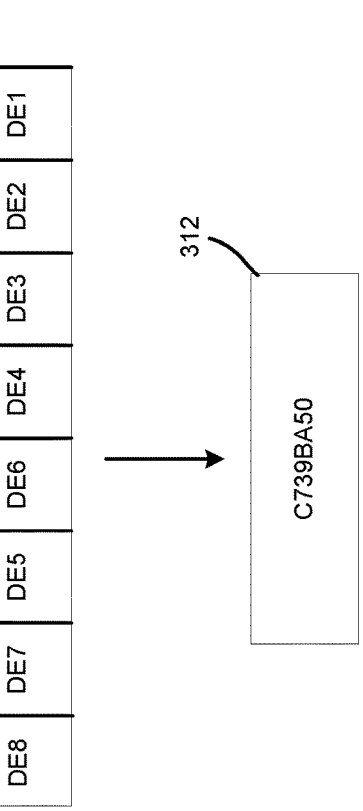
FIG. 3C illustrates an example of a third signature computed by the fuzzy scoreboard for a third data stream, according to some embodiments.
Figure 3A:
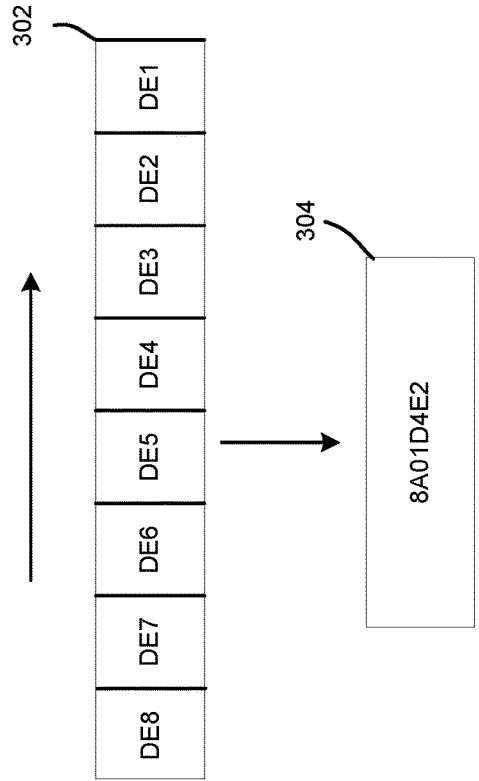
FIG. 3A illustrates an example of a first signature computed by a fuzzy scoreboard for a first data stream, according to some embodiments.

FIG. 3A illustrates an example of a first signature computed by a fuzzy scoreboard for a first data stream, according to some embodiments.

FIG. 3A shows a first data stream 302 that can be fed to the DUT 104 during a datapath test. The first data stream 302 can be an example of the input data stream 116. The first data stream 302 can include data elements DE1, DE2, DE3, DE4, DE5, DE6, DE7, and DE8. The first data stream 302 can be fed to the DUT 104 in the order of DE1, DE2, DE3. DE4, DE5, DE6, DE7, and DE8, with the DE1 being the first data element to be fed. For example, a datapath test may be performed to test a pipeline in the DUT 104, which can output the data elements in the same order as it receives them. In such cases, the reference model 106 may not be used and the expected data stream 120 can be same as the input data stream 116.

The fuzzy scoreboard module 202 can be used to compute a first signature 304 of the first data stream 302 using a signature function, as shown in FIG. 3A. As an example, the signature function can be a hash function, which may generate a hash value "8A01D4E2" for the first signature 304. The fuzzy scoreboard module 202 can store the first signature 304 for a subsequent comparison with a second data stream outputted from the DUT 104, as shown in FIG. 3B.

FIG. 3B illustrates an example of a second signature computed by a fuzzy scoreboard for a second data stream, according to some embodiments.

FIG. 3B shows a second data stream 306 that can be outputted from the DUT 104 during the datapath test as or after the first data stream 302 is fed to the DUT 104. The second data stream 306 can include the data elements DE1, DE2, DE3, DE4, DE5, DE6, DE7, and DE8 in an order with the DE1 being a first data element out. The second data stream 306 can be an example of the output data stream 118. The fuzzy scoreboard module 202 can be used to compute a second signature 308 of the second data stream 306 using the same hash function that was used to generate the first signature 304. Since the order and value of each data element in the second data stream 306 outputted from the DUT 104 is same as the order and value of each data element in the first data stream 302, the second signature 308 may have a same hash value "8A01D4E2" as the first signature 304. However, if there is a mismatch in the order or value of any of the data elements in the second data stream 306 and the first data stream 302, then the signatures may be different as shown in FIG. 3C.

Note that in various examples, the first signature 304 and the second signature 308 may be computed at different stages of the datapath test as long as the number of data elements in the second data stream 306 and the first data stream 304 used in their respective signatures are the same. For example, the first signature 304 and the second signature 308 may be computed at the end of the test when the DE1-DE8 have been fed into the DUT 104 and the DE1-DE8 have been outputted from the DUT 108. Alternatively, the first signature 304 and the second signature 308 may be computed in the middle of the test when the DE1-DE5 have been fed into the DUT 104 and the DE1-DE5 have been outputted from the DUT 108, and so on.

FIG. 3C illustrates an example of a third signature computed by the fuzzy scoreboard for a third data stream, according to some embodiments.

FIG. 3C shows a third data stream 310 which includes the data elements DE6 and DE5 in the wrong order as compared to the first data stream 302. In some examples, the third data stream 310 can be the output data stream 118 during the datapath test. For example, in some cases, the DUT 104 may not behave as expected due to a DUT design error or a testbench error, and therefore, the data elements in the output data stream 118 may not be in the same order or may have different values than the expected data stream 120. In such cases, the signature computed by the fuzzy scoreboard module 202 may be different than the first signature 304. For example, the fuzzy scoreboard module 202 may compute a third signature 312 with a hash value "C739BA50" using the same hash function that was used to compute the first signature 304. Since the third signature 312 is different than the first signature 304, it may indicate failure of the datapath test.

In some embodiments, when there is a mismatch between the data elements, a generic scoreboard can be used to identify the mismatched data elements. For example, the scoreboard module 102 can be used to repeat the datapath test by feeding the first data stream 302 into the DUT 104 in the testbench 100. The output data stream 118 can be stored from the repeated datapath test and compared with the stored expected data stream 122 to identify the difference between the third data stream 310 and the first data stream 302, which can be indicated by the result 124.

Note the FIGS. 3A-3C show an example use case for the fuzzy scoreboard module 202 when the order and the values of the data elements have to be checked. However; it will be noted that the fuzzy scoreboard module 202 can also be used to check that all the data elements from the first data stream 302 are outputted in the second data stream 306 without checking the order or the sequence of the data elements by using appropriate signature functions (e.g., commutative functions can be used when checking the order of the data elements is not required).

Figure 4:
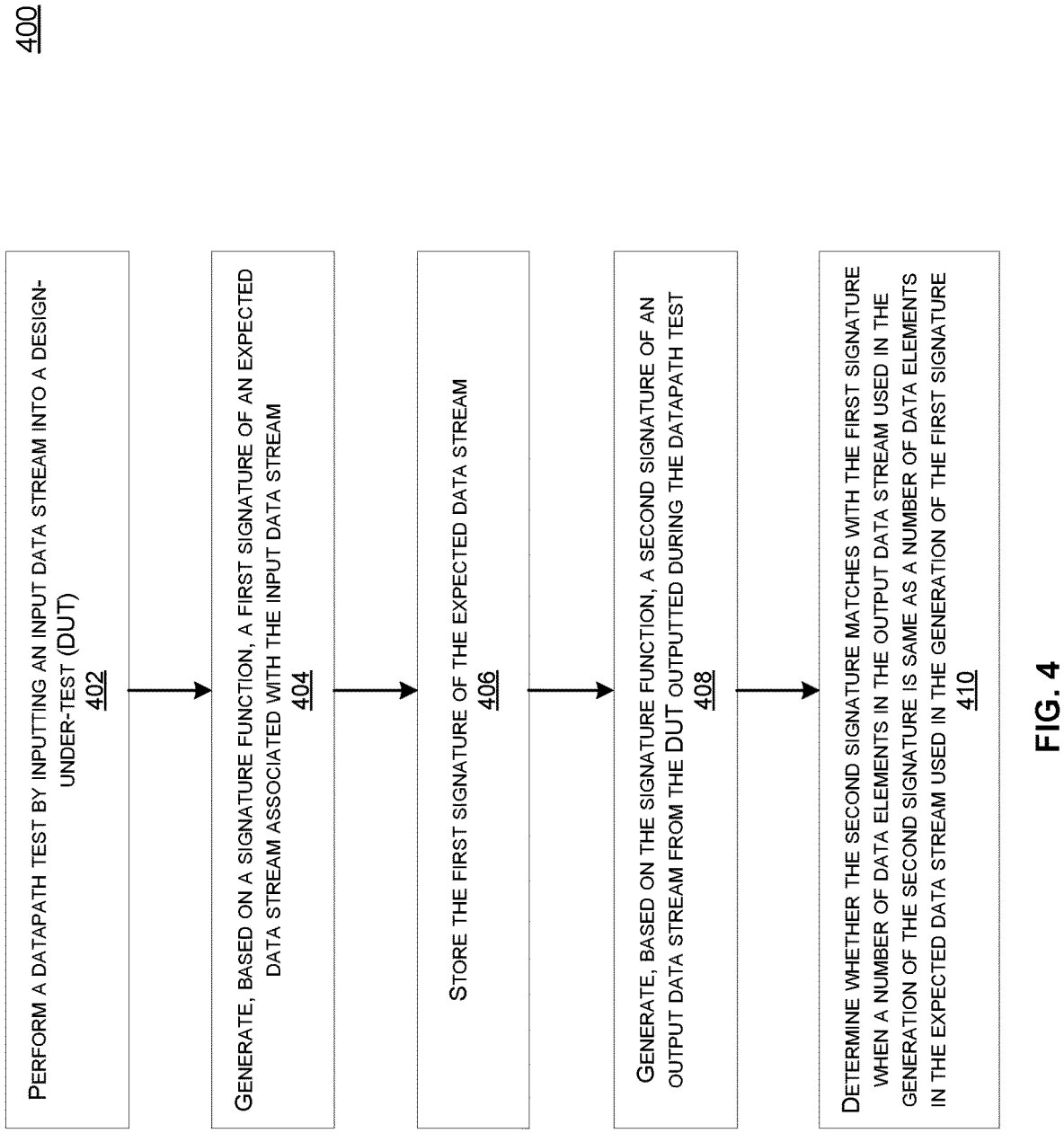
FIG. 4 illustrates a flowchart for an example computer-implemented method that can be performed by the fuzzy scoreboard, according to some embodiments.

FIG. 4 illustrates a flowchart 400 for an example computer-implemented method that can be performed by a scoreboard, according to some embodiments. For example, the computer-implemented method may be performed by the fuzzy scoreboard module 202 in the testbench 200. The computer-implemented method can be executed when certain instructions, which are stored in a non-transitory computer readable medium, are executed by one or more processors of a computing device. For example, the computing device can be part of a computer or a server which can also support running the datapath test using a testbench in a suitable verification environment.

In step 402, the method may include performing a datapath test by inputting an input data stream into a DUT. As an example, the input data stream can be the input data stream 116, which can be fed to the DUT 104 in the testbench 200. In some examples, the input data stream 116 can be same as the first data stream 302 shown in FIG. 3A. The datapath test may include inputting the data elements of the first data stream 302 into the DUT 104 starting with the data element DE1.

In step 404, the method may include generating, based on a signature function, a first signature of an expected data stream associated with the input data stream. The expected data stream can be the expected data stream 120. The first data stream 302 can be received by the input module 204 of the fuzzy scoreboard module 202. The input signature generator 206 may generate a first signature of the expected data stream 120 using a signature function. For example, the input signature generator 206 may generate the first signature 304 of the first data stream 302 using a hash function as shown in FIG. 3A.

In step 406, the method may include storing the first signature of the expected data stream. The compact data storage module 208 in the fuzzy scoreboard module 202 may store the first signature 304 of the expected data stream 120 using a suitable data structure. For example, the fuzzy scoreboard module 202 may store the first signature 304 in a register.

In step 408, the method may include generating, based on the signature function, a second signature of an output data stream from the DUT outputted during the datapath test. The output signature generator 210 in the fuzzy scoreboard module 202 may generate the second signature 220 of the output data stream 118 from the DUT 104. As an example, the output data stream 118 can be the second data stream 306 in FIG. 3B. The output signature generator 210 may generate the second signature 306 of the second data stream 306 using the same hash function.

In step 410, the method may include determining whether the second signature matches with the first signature when a number of data elements in the output data stream used in the generation of the second signature is same as a number of data elements in the expected data stream used in the generation of the first signature. For example, the comparator module 212 in the fuzzy scoreboard module 202 may compare the second signature 306 with the first signature 304 to determine if there is a match when the first data stream 302 and the second data stream 306 are in sync with respect to the number of data elements. The output of the comparison can be provided in the result 216 by the results module 214. In some examples, if the result 216 indicates a failure of the datapath test, the datapath test can be repeated using the scoreboard module 102 to identify the difference between the output data stream 118 and the input data stream 116.

Thus, some embodiments can provide techniques to reduce the memory usage of a scoreboard used in the verification environment to test a DUT. In various embodiments, multiple instances of fuzzy scoreboards can be used to test different components or features of a DUT in parallel using appropriate signature functions, or a single fuzzy scoreboard instance can be reused to test different components or functions of a DUT. The fuzzy scoreboard described with reference to FIGS. 2-4 can be used to provide a reliable and low memory utilization comparison of the data streams for semi-formal as well as traditional formal verification process. Furthermore, the fuzzy scoreboard can be used in emulation environments at a negligible cost, which can provide significant cost savings for testing large and complex designs. In simulations, the fuzzy scoreboard can provide a better alternative instead of a large FIFO used by a full scoreboard. Additionally, the fuzzy scoreboard can provide significant cost savings for testing the data streams that do not preserve order, in comparison to using the generic scoreboards or checkers that provide complicated and memory intensive solutions.

Figure 5:
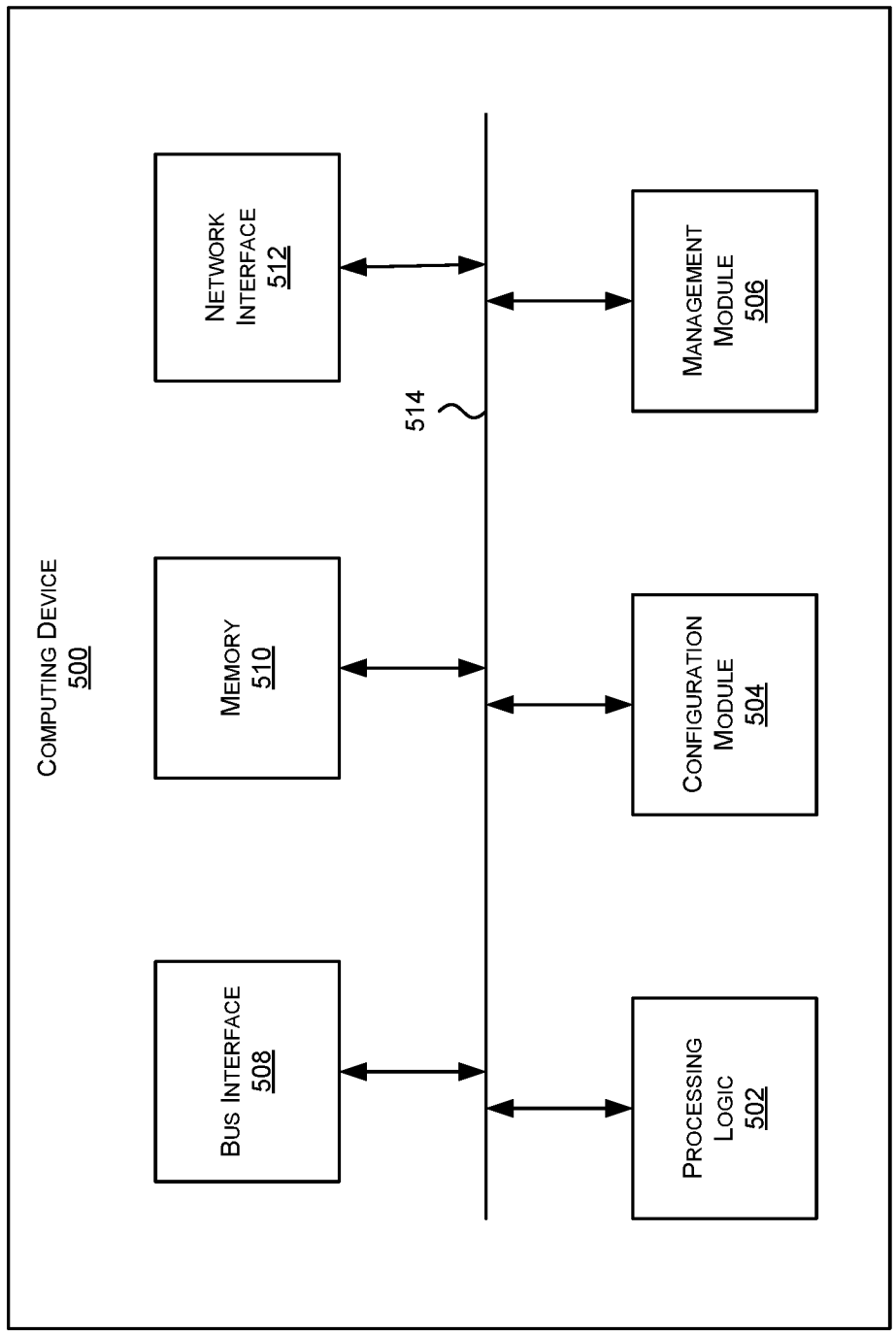
FIG. 5 illustrates an example of a computing device, according to certain aspects of the disclosure.

FIG. 5 illustrates an example of a computing device 500. Functionality and/or several components of the computing device 500 may be used without limitation with other embodiments disclosed elsewhere in this disclosure, without limitations. A computing device 500 may facilitate processing of packets and/or forwarding of packets from the computing device 500 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 500 may be the recipient and/or generator of packets. In some implementations, the computing device 500 may modify the contents of the packet before forwarding the packet to another device. The computing device 500 may be a peripheral device coupled to another computer device, a switch, a router or any other suitable device enabled for receiving and forwarding packets.

In one example, the computing device 500 may include processing logic 502, a configuration module 504, a management module 506, a bus interface module 508, memory 510, and a network interface module 512. These modules may be hardware modules, software modules, or a combination of hardware and software. In certain instances, modules may be interchangeably used with components or engines, without deviating from the scope of the disclosure. The computing device 500 may include additional modules, not illustrated here. In some implementations, the computing device 500 may include fewer modules. In some implementations, one or more of the modules may be combined into one module. One or more of the modules may be in communication with each other over a communication channel 514. The communication channel 514 may include one or more busses, meshes, matrices, fabrics, a combination of these communication channels, or some other suitable communication channel.

The processing logic 502 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 502 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 502 may be stored on a computer-readable storage medium, for example, in the form of a computer program. The computer-readable storage medium may be non-transitory. In some cases, the computer-readable medium may be part of the memory 510.

The memory 510 may include either volatile or non-volatile, or both volatile and non-volatile types of memory. The memory 510 may, for example, include random access memory (RAM), read only memory (ROM), Electrically Erasable Programmable Read-Only Memory (EEPROM), flash memory, and/or some other suitable storage media. In some cases, some or all of the memory 510 may be internal to the computing device 500, while in other cases some or all of the memory may be external to the computing device 500. The memory 510 may store an operating system comprising executable instructions that, when executed by the processing logic 502, provides the execution environment for executing instructions providing networking functionality for the computing device 500. The memory may also store and maintain several data structures and routing tables for facilitating the functionality of the computing device 500.

In some implementations, the configuration module 504 may include one or more configuration registers. Configuration registers may control the operations of the computing device 500. In some implementations, one or more bits in the configuration register can represent certain capabilities of the computing device 500. Configuration registers may be programmed by instructions executing in the processing logic 502, and/or by an external entity, such as a host device, an operating system executing on a host device, and/or a remote device. The configuration module 504 may further include hardware and/or software that control the operations of the computing device 500.

In some implementations, the management module 506 may be configured to manage different components of the computing device 500. In some cases, the management module 506 may configure one or more bits in one or more configuration registers at power up, to enable or disable certain capabilities of the computing device 500. In certain implementations, the management module 506 may use processing resources from the processing logic 502. In other implementations, the management module 506 may have processing logic similar to the processing logic 502, but segmented away or implemented on a different power plane than the processing logic 502.

The bus interface module 508 may enable communication with external entities, such as a host device and/or other components in a computing system, over an external communication medium. The bus interface module 508 may include a physical interface for connecting to a cable, socket, port, or other connection to the external communication medium. The bus interface module 508 may further include hardware and/or software to manage incoming and outgoing transactions. The bus interface module 508 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 508 may include the physical layer for any of these bus protocols, including a connector, power management, and error handling, among other things. In some implementations, the computing device 500 may include multiple bus interface modules for communicating with multiple external entities. These multiple bus interface modules may implement the same local bus protocol, different local bus protocols, or a combination of the same and different bus protocols.

The network interface module 512 may include hardware and/or software for communicating with a network. This network interface module 512 may, for example, include physical connectors or physical ports for wired connection to a network, and/or antennas for wireless communication to a network. The network interface module 512 may further include hardware and/or software configured to implement a network protocol stack. The network interface module 512 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 500 may include multiple network interface modules, each configured to communicate with a different network. For example, in these implementations, the computing device 500 may include a network interface module for communicating with a wired Ethernet network, a wireless 802.11 network, a cellular network, an Infiniband network, etc.

The various components and modules of the computing device 500, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 5, FIG. $$$, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A testbench comprising:
an input module configured to receive an expected data stream for a datapath test of a design-under-test (DUT);
an input signature generator configured to generate a first signature of the expected data stream based on a signature function;
a data storage module configured to store the first signature of the expected data stream without storing the expected data stream;
an output signature generator configured to generate a second signature of an output data stream from the DUT based on the signature function;
a comparator module configured to compare the second signature with the first signature when a number of data elements in the output data stream used in the generation of the second signature is same as a number of data elements in the expected data stream used in the generation of the first signature; and
a results module configured to provide a result of the comparison,
wherein the testbench is configured to:
repeat the datapath test in response to the second signature mismatching the first signature;
store an output data stream of the repeated datapath test; and
compare the stored output data stream of the repeated datapath test with the expected data stream using a data structure to identify a difference between the output data stream and the expected data stream.

2. The testbench of claim 1, wherein the expected data stream is an input data stream inputted to the DUT when performing a datapath test.

3. The testbench of claim 1, wherein the expected data stream is generated by a reference model for the DUT based on an input data stream when performing a datapath test, wherein the reference model is a behavioral model of the DUT.

4. The testbench of claim 1, wherein the testbench is part of a simulation environment, a formal verification environment, or an emulation environment.

5. A computer-implemented method, comprising:
performing a datapath test by inputting an input data stream into a design-under-test (DUT);
generating, based on a signature function, a first signature of an expected data stream associated with the input data stream;
storing the first signature of the expected data stream;
generating, based on the signature function, a second signature of an output data stream from the DUT outputted during the datapath test;
determining whether the second signature matches with the first signature when a number of data elements in the output data stream used in the generation of the second signature is same as a number of data elements in the expected data stream used in the generation of the first signature;
repeating the datapath test in response to determining that the second signature mismatches the first signature;
storing an output data stream of the repeated datapath test; and
comparing the stored output data stream of the repeated datapath test with a stored expected data stream using a data structure to identify a difference between the output data stream and the expected data stream.

6. The computer-implemented method of claim 5, wherein determining that the second signature matches with the first signature indicates that data elements in the output data stream have a same ordering and values as data elements in the input data stream.

7. The computer-implemented method of claim 5, wherein determining that the second signature mismatches with the first signature indicates that the input data stream and the output data stream have a different order, or that a data element in the input data stream has a different value than a corresponding data element in the output data stream.

8. The computer-implemented method of claim 5, wherein the signature function is a hash function.

9. The computer-implemented method of claim 5, wherein the signature function is based on a cyclic redundancy check (CRC) code, Reed-Solomon code, or Hamming code.

10. The computer-implemented method of claim 5, wherein the signature function is a commutative function.

11. The computer-implemented method of claim 5, wherein the signature function is a non-commutative function.

12. The computer-implemented method of claim 5, wherein the expected data stream is same as the input data stream when the DUT is configured to output data elements in the output data stream in a same order and values as data elements in the input data stream.

13. The computer-implemented method of claim 5, wherein the expected data stream is generated from a reference model using the input data stream when the output data stream from the DUT is expected to be different than the input data stream.

14. The computer-implemented method of claim 5, wherein the datapath test is performed in a simulation environment, formal verification environment, or an emulation environment.

15. The computer-implemented method of claim 5, wherein the first signature of the expected data stream takes less storage space than the expected data stream.

16. The computer-implemented method of claim 5, wherein the signature function is implemented in a testbench.

17. The computer-implemented method of claim 16, wherein the testbench is written in a hardware verification language or a programming language.

18. A non-transitory computer readable medium having stored therein instructions that, when executed by one or more processors, cause the one or more processors to execute a method comprising:
performing a datapath test by inputting an input data stream into a design-under-test (DUT);
generating, based on a signature function, a first signature of an expected data stream associated with the input data stream;
storing the first signature of the expected data stream;
generating, based on the signature function, a second signature of an output data stream from the DUT outputted during the datapath test;
determining whether the second signature matches with the first signature when a number of data elements in the output data stream used in the generation of the second signature is same as a number of data elements in the expected data stream used in the generation of the first signature;

repeating the datapath test in response to determining that the second signature mismatches the first signature;

storing an output data stream of the repeated datapath test; and comparing the stored output data stream of the repeated datapath test with a stored expected data stream using a data structure to identify a difference between the output data stream and the expected data stream.

19. The non-transitory computer readable medium of claim 18, wherein determining that the second signature matches with the first signature indicates that data elements in the output data stream have a same ordering and values as data elements in the expected data stream.

20. The non-transitory computer readable medium of claim 18, wherein the signature function is based on an error-correcting code (ECC), a cyclic redundancy check (CRC) code, a commutative function, a non-commutative function, or a hash function.

21. The non-transitory computer readable medium of claim 18, wherein the method is performed by a scoreboard module in a testbench.

* * * * *